United States Patent
Ararao et al.

(10) Patent No.: US 10,693,020 B2
(45) Date of Patent: Jun. 23, 2020

(54) SEMICONDUCTOR DEVICE PACKAGE AND METHOD FOR USE THEREOF

(71) Applicant: TT Electronics PLC, Carrollton, TX (US)

(72) Inventors: Virgil Cotoco Ararao, McKinney, TX (US); Brent Hans Larson, Dallas, TX (US)

(73) Assignee: TT ELECTRONICS PLC, Carrollton, TX (US)

( * ) Notice: Subject to any disclaimer, the term of this patent is extended or adjusted under 35 U.S.C. 154(b) by 90 days.

(21) Appl. No.: 15/995,510

(22) Filed: Jun. 1, 2018

(65) Prior Publication Data
US 2019/0371944 A1 Dec. 5, 2019

(51) Int. Cl.
H01L 31/02 (2006.01)
H01L 31/0203 (2014.01)
B81B 7/00 (2006.01)

(52) U.S. Cl.
CPC ...... H01L 31/02002 (2013.01); B81B 7/0006 (2013.01); H01L 31/0203 (2013.01); B81B 2201/02 (2013.01)

(58) Field of Classification Search
CPC ......... H01L 27/14632; H01L 27/14636; H01L 27/14643; H01L 27/1469; H01L 27/146; H01L 31/0203; H01L 31/02002; H01L 31/0232; H01L 31/02327; H01L 2224/48247; H01L 2224/73265; G02F 1/13318; G02F 2001/13312; H05K 1/0274; H05K 1/18; H05K 2201/10121; B81B 7/0006; B81B 2201/02
See application file for complete search history.

(56) References Cited

U.S. PATENT DOCUMENTS

| 6,140,144 A | * | 10/2000 | Najafi | B81C 1/00269 438/106 |
| 2007/0146716 A1 | | 6/2007 | Dudelzak et al. | |
| 2008/0283990 A1 | * | 11/2008 | Nasiri | B81C 1/00238 257/684 |
| 2009/0194798 A1 | * | 8/2009 | Tai | H01L 27/14618 257/291 |
| 2011/0108308 A1 | | 5/2011 | Kamada | |
| 2012/0270354 A1 | * | 10/2012 | Hooper | G01L 19/141 438/51 |
| 2013/0050227 A1 | | 2/2013 | Petersen et al. | |
| 2013/0051586 A1 | * | 2/2013 | Stephanou | H04R 1/04 381/173 |

OTHER PUBLICATIONS

PCT International Search Report and the Written Opinion, Application No. PCT/US 19/34185 dated Aug. 8, 2019, 12 pages.

* cited by examiner

Primary Examiner — John R Lee
(74) Attorney, Agent, or Firm — Haynes and Boone, LLP

(57) ABSTRACT

An optical detector device including: a glass substrate having conductive traces plated thereon; a semiconductor device having an optical detector exposed on a side facing the glass substrate, the semiconductor device further including a plurality of bond pads electrically coupled to a first subset of the conductive traces; a metallic seal structure bonding a side of the glass substrate having the conductive traces with the side of the semiconductor device facing the glass substrate; and a plurality of conductive structures outside of a perimeter of the semiconductor device, the plurality of conductive structures being electrically coupled to a second subset of the conductive traces.

23 Claims, 10 Drawing Sheets

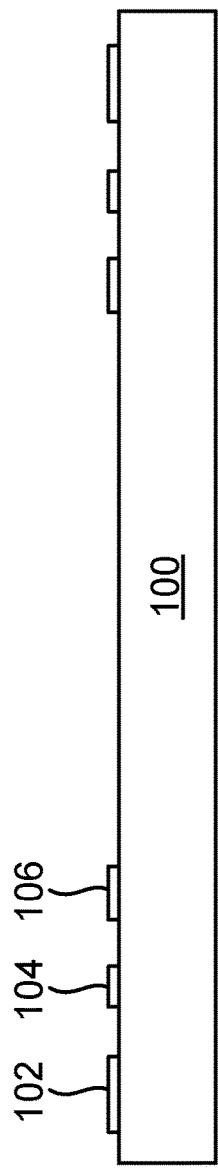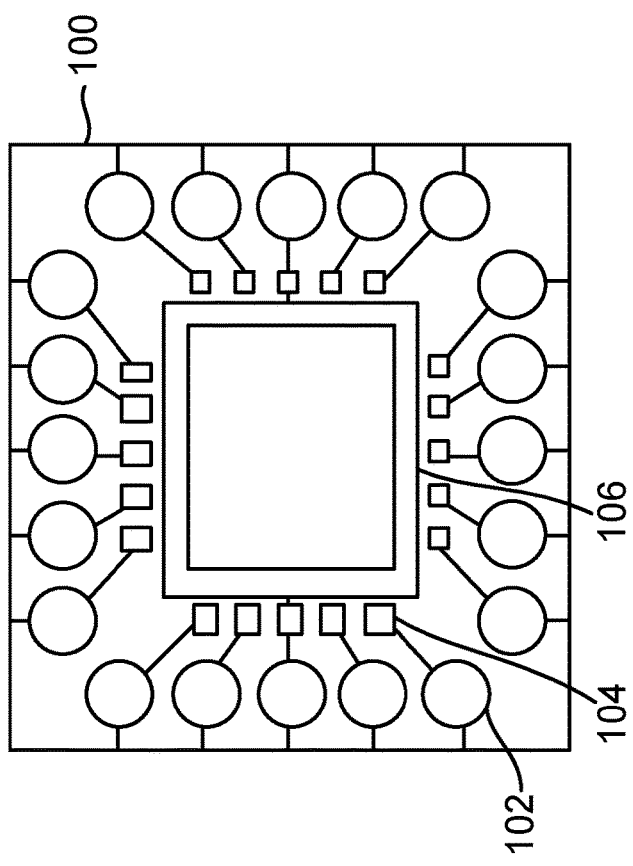

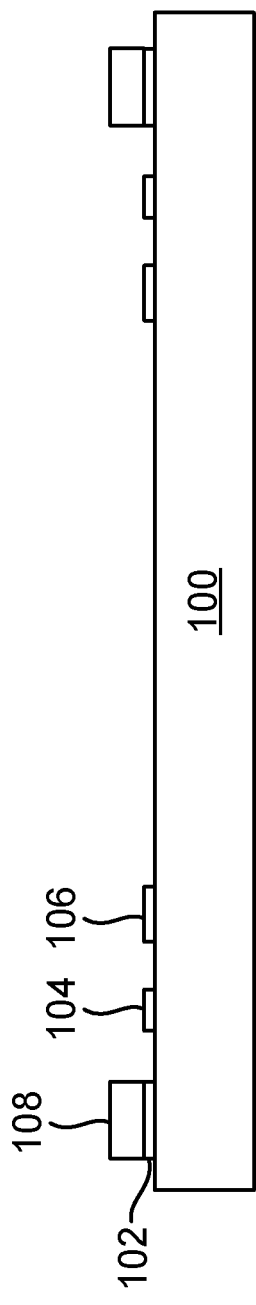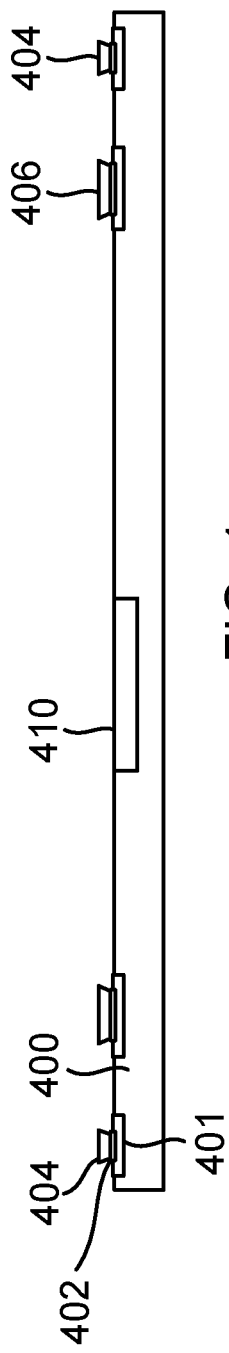

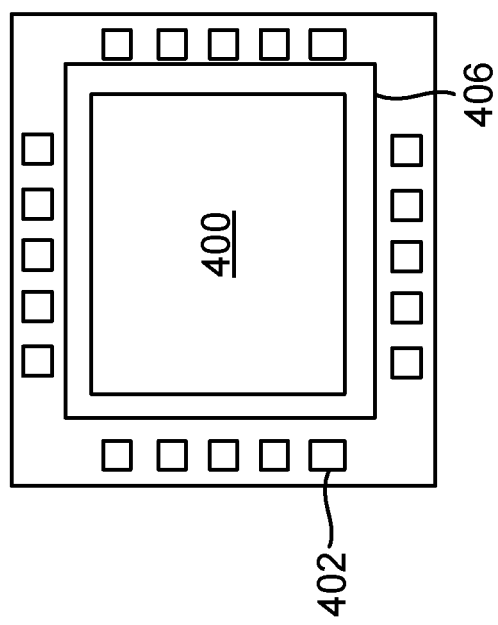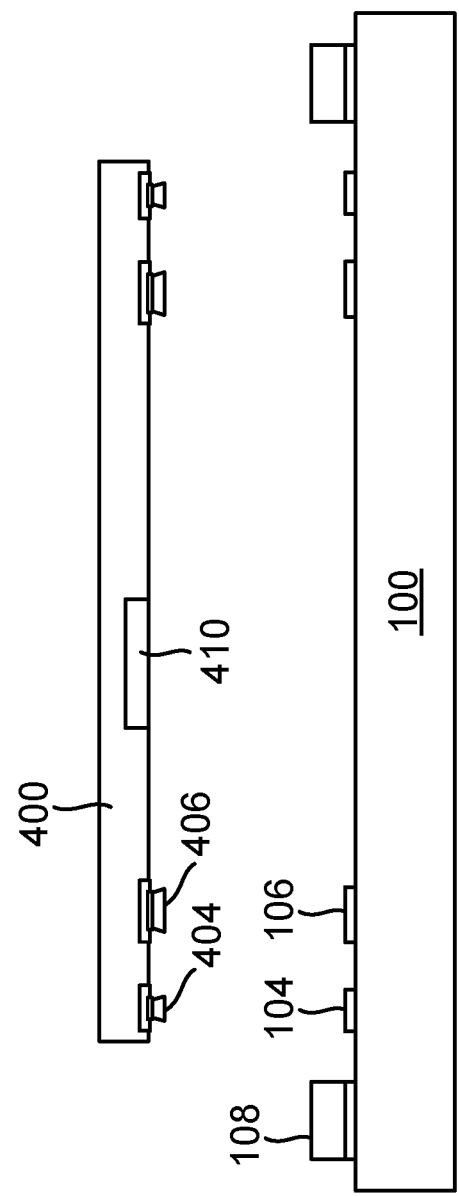

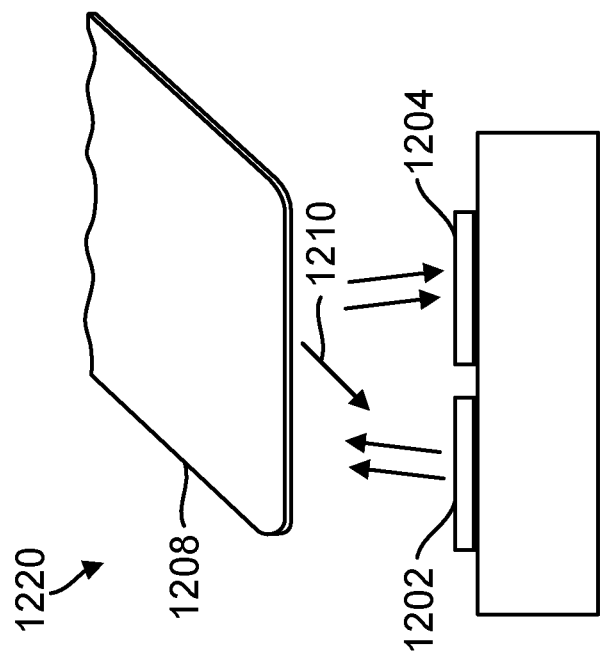
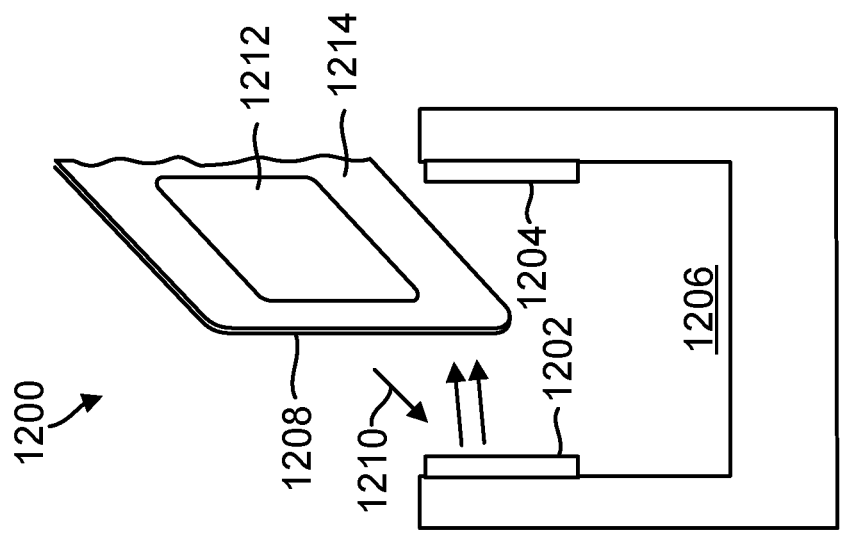
FIG. 12A
FIG. 12B ized to that the amount of the pat. No. US 10,693,020 B2

SEMICONDUCTOR DEVICE PACKAGE AND METHOD FOR USE THEREOF

BACKGROUND

Some conventional optical detector packages include an integrated circuit mounted to a printed circuit board (PCB). Bond pads of the integrated circuits are coupled to traces of the PCB using bond wires. In one example of a conventional system, the integrated circuit is covered with a clear molding compound. Such conventional chip packages may be relatively inexpensive and applicable to a variety of different applications. However one disadvantage of such a chip package is that the over molding compound may have a temperature limitation of about 105° C. Specifically, the over molding compound may have a high coefficient of thermal expansion and may shear the bond wires if exposed to high temperatures. The over molding compound may also change optical transmission properties if exposed to high temperatures.

In another example, a conventional optical detector chip package includes an integrated circuit mounted to a PCB within a recess of the PCB. Once again, bond pads of the integrated circuit are coupled to traces of the PCB using bond wires. A glass lid is placed over the top of the integrated circuit and the bond wires with enough headroom to clear the bond wires. The glass lid may be bonded to the PCB using a conventional adhesive.

One disadvantage of such conventional example is that the amount of space between the top of the integrated circuit and the top of the glass lid may be large enough to cause noticeable diffraction. This may be due to not only the thickness of the glass lid, but also the headroom to accommodate the bond wires. Diffraction is a known phenomenon and may not be disadvantageous in some applications, but other applications may use higher precision measurements and may benefit from lower diffraction. Another potential disadvantage of some conventional chip packages is that the adhesive between the glass lid and the PCB may have a temperature limitation of about 125° C., suffering loss of integrity after exposure to higher temperatures.

Therefore, there is a need in the art for chip packages that have a higher heat specification and may provide a thinner profile to reduce diffraction.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIG. 1 is an illustration of an example glass substrate, in accordance with some embodiments.

FIG. 2 is an illustration of an example pattern of metal plating on a glass substrate, in accordance with some embodiments.

FIG. 3 shows an example glass substrate having copper pillars formed thereon, in accordance with some embodiments.

FIG. 4 shows an example semiconductor device for use with the glass substrate of FIG. 1, in accordance with some embodiments.

FIG. 5 illustrates an example solder pattern on the semiconductor device of FIG. 4, in accordance with some embodiments.

FIG. 6 shows an example action of aligning and mounting the semiconductor device of FIG. 4 on the glass substrate of FIG. 1, in accordance with some embodiments.

FIGS. 12A and 12B illustrate applications of the semiconductor device package, in accordance with some embodiments.

SUMMARY

Figure 7:
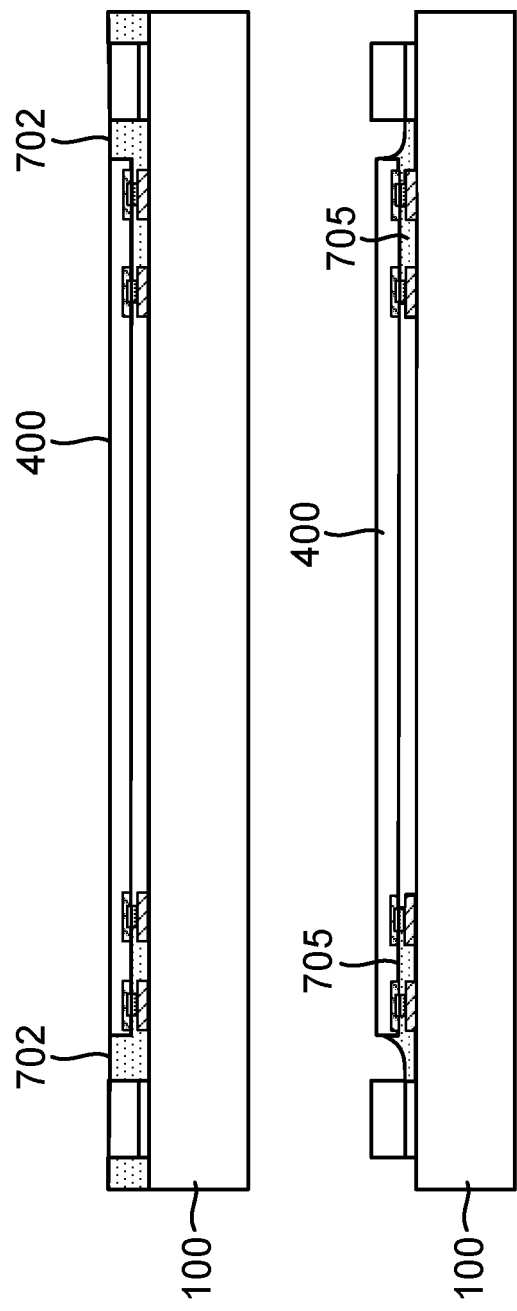
FIG. 7 shows two examples of a semiconductor device being mounted to a glass substrate, in accordance with an embodiment.

One example embodiment provides chip packages with a higher heat specification by replacing some low temperature components (e.g., clear over molding or low-temperature adhesive) with higher temperature components, such as glass and metallic bonding. For example, one embodiment includes a semiconductor chip mounted to a glass substrate using a diffusion bonded metallic seal ring. Thus, such an example chip package may be exposed to relatively high temperatures (e.g., 100° C.-400° C.) during later assembly processes or in the field, while still providing structural integrity. Such example may also provide a thinner profile to reduce diffraction by replacing bond wires with metal plating on the glass substrate. For instance, the metal plating may be electrically coupled with bond pads of the semiconductor chip and further electrically coupled to an external electrical connector.

One example embodiment includes an optical detector device having: a glass substrate having conductive traces plated thereon; a semiconductor device having an optical detector exposed on a side facing the glass substrate, the semiconductor device further including a plurality of bond pads electrically coupled to the conductive traces; a metallic seal structure bonding a side of the glass substrate having the conductive traces with the side of the semiconductor device facing the glass substrate; and a plurality of conductive structures outside of a perimeter of the semiconductor device, the plurality of conductive structures being electrically coupled to the conductive traces.

Another example embodiment includes the method for using an optical detector device, wherein the optical detector device comprises a semiconductor device having an optical detector exposed on a side facing a glass substrate and wherein the semiconductor device is bonded to the glass substrate using a metallic seal structure, the method including: receiving light at the optical detector through the glass substrate; in response to receiving the light at the optical detector, sending a first electrical signal from the semiconductor device to a first set of conductive traces on the glass substrate by a bond pad of the semiconductor device; and receiving the first electrical signal at a computing device by a conductive structure on the glass substrate and outside of a perimeter of the semiconductor device, the computing device being electrically coupled to the conductive structure on the glass substrate by a conductive structure on a printed circuit board (PCB) on which the conductive structure on the glass substrate is coupled.

Yet another example embodiment includes an optical sensor system having: a glass substrate configured to pass light from an outside environment to a surface of a semiconductor device; means for conducting electric signals, wherein the conducting means are formed on a surface of the glass substrate; means for detecting the light through the glass substrate and for generating the electric signals in response to the light, wherein the light detecting means are formed on the semiconductor device, the semiconductor device further including a plurality of bond pads electrically coupled to the electric signal conducting means; means for bonding the glass substrate to the semiconductor device; and a plurality of conductive structures outside of a perimeter of the semiconductor device, the plurality of conductive structures being electrically coupled to the electric signal conducting means.

Yet another example embodiment includes a motion or acceleration detector device having: a glass substrate having conductive traces plated thereon; a semiconductor device having a MEMS device therein, the semiconductor device further including a plurality of bond pads electrically coupled to the conductive traces; a metallic seal structure bonding a side of the glass substrate having the conductive traces with the side of the semiconductor device facing the glass substrate; and a plurality of conductive structures outside of a perimeter of the semiconductor device, the plurality of conductive structures being electrically coupled to the conductive traces. The motion or acceleration detector further includes a computing device in communication with the semiconductor device to receive signals from the semiconductor device and to detect or determine motion or acceleration therefrom.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. Any alterations and further modifications to the described devices, systems, methods, and any further application of the principles of the present disclosure are fully contemplated as would normally occur to one having ordinary skill in the art to which the disclosure relates. For example, the features, components, and/or steps described with respect to one embodiment may be combined with the features, components, and/or steps described with respect to other embodiments of the present disclosure to form yet another embodiment of a device, system, or method according to the present disclosure even though such a combination is not explicitly shown. Further, for the sake of simplicity, in some instances the same reference numerals are used throughout the drawings to refer to the same or like parts.

Various embodiments provide a semiconductor chip package that may be appropriate for higher temperature applications and may also include a lower profile than some conventional designs. Furthermore, the examples herein are described with respect to an optical sensor package design, although the scope of embodiments is not limited just to optical sensors. Rather, the concepts described herein may be applied just as well to microelectronic mechanical systems (MEMS) semiconductor chip packages.

The present disclosure is generally related to semiconductor chip packages. In one example, the chip package includes a glass substrate and a semiconductor device bonded to the glass substrate. The glass substrate has conductive traces plated on a surface that faces the semiconductor device. The semiconductor device has an optical detector exposed on its side that faces the glass substrate. The semiconductor device also includes multiple bond pads that are electrically coupled to some of the conductive traces on the glass substrate. The example further includes a metallic seal structure that bonds the side of the glass substrate with the conductive traces with the side of the semiconductor device that faces the glass substrate. Thus, the semiconductor device may transmit electrical signals through its bond pads and to the conductive traces. Of course, some embodiments may be designed to be mounted to a printed circuit board (PCB) or other substrate having electrical connections. Thus, the example chip package also includes conductive structures outside of a perimeter of the semiconductor device, wherein those conductive structures provide electrical communication between at least some of the conductive traces and an electrical connection of a PCB or other substrate.

Continuing with the example, the chip package may be mounted to a PCB by those conductive structures, or examples of those conductive structures may include solder balls either alone or in use with conductive pillars. When mounted, the chip package is placed so that the semiconductor device is below the glass substrate, and the glass substrate is physically and electrically coupled to the PCB by its conductive structures. In one example arrangement, an optical detector is formed on the side of the semiconductor chip that is facing the glass substrate to allow the optical detector to receive photons through the glass substrate.

Furthermore, other examples may include the PCB also having a computing device, such as an application specific integrated circuit (ASIC), CPU, microcontroller, or other processing device electrically coupled with the semiconductor device of the chip package by, e.g., traces in the PCB. Thus, an example method of use includes receiving light at the optical detector through the glass substrate. Then, in response to receiving the light, the chip that has the optical detector sends an electrical signal from the chip to conductive traces on the glass substrate by a bond pad of the chip. The computing device receives the electrical signal by one or more conductive structures on the glass substrate and one or more conductive structures within the PCB. The computing device may then perform any appropriate processes or algorithms on the electrical signal. Examples include the device being implemented in an optical encoder, where the computing device may determine motion of an optical encoder structure through analyzing the electrical signal. Of course, various embodiments may be included in applications other than optical encoders. In fact, the scope of embodiments includes any appropriate application for the chip package described herein.

Various embodiments may provide advantages over conventional systems. For instance, some embodiments reduce or eliminate the use of polymeric materials, such as adhesives and over molding compounds, and replace those materials with glass and metal, which may withstand higher temperatures. Furthermore, embodiments that create a hermetic seal between a semiconductor die and the glass substrate may experience lower die surface degradation by reducing or eliminating moisture permeation over time. Both optical detector devices and MEMS devices may benefit from a reduction or elimination of moisture permeation.

Furthermore, reducing or eliminating the use of bond wires may further provide a device that has a low profile. Thus, devices that replace bond wires with metal plating on the glass may reduce an amount of distance between a top of the semiconductor device and a top of the glass substrate, thereby reducing diffraction in light that is received through the glass substrate.

FIG. 1 is an illustration of glass substrate 100, according to one embodiment. Glass substrate 100 may be any appropriate thickness and may start out as a circular wafer or as a rectangular shape. Furthermore, the processes described herein may be performed before a given glass piece is singulated so that the patterns described are created multiple times on either a wafer or a rectangular piece. In other embodiments, the processes described herein may be performed after singulation on a single die-sized substrate.

Glass substrate 100 includes metal plating components 102, 104, 106. Metal plating component 106 in this example is included in a metal seal ring, which is discussed in more detail below. Metal plating component 104 in this example is a contact for a conductive trace, and it corresponds to a bond pad on the semiconductor device, as explained in more detail below. Metal plating component 102 is outside the periphery of components 106 and 104 and may be used for electrical contact with a PCB or other substrate. As explained in more detail below, metal plating component 102 may be a base for a copper pillar or a solder ball in some embodiments.

FIG. 1 shows an end-on view of a single die-sized glass substrate 100. FIG. 2 provides a top down view of the same glass substrate 100. FIG. 2 illustrates that metal plating component 102 is one example of multiple components just like it that surround the bond pad contacts 104 and seal ring 106. Each of the metal plating components 102 may correspond to a conductive component that is physically and electrically coupled to a PCB or other substrate. This is explained in more detail below.

Similarly, metal plating component (e.g., bond pad contacts) 104 is one example of multiple components just like it that surround the seal ring 106. Each of the metal plating components 104 and metal plating components 102 are connected by traces, and they are structures for conducting electrical signals from the bond pads of a semiconductor device to electrical contacts on a PCB or other substrate. FIG. 1 shows two examples of metal plating component 102 (i.e., the one identified with reference marker 102, and the metal plating component just like it to the far right on the top surface of glass substrate 100). FIG. 1 also shows two examples of metal plating component 104 (i.e., the one identified with reference marker 104, and the metal plating component placed symmetrically on the right-hand side of the top surface of glass substrate 100).

FIG. 2 also illustrates metal plating component 106 as a top part of the seal ring, and it is shaped in this example substantially as a rectangle. However, the scope of embodiments may include any appropriate shape for metal plating component 106. Of note in FIG. 2 is that metal plating component 106 does not have any discontinuities, and it forms a closed shape. This allows the metal seal ring to be formed as a hermetic seal, as explained in more detail below.

Metal plating components 102, 104, 106 may be formed on glass substrate 100 using any appropriate techniques. In one example, a sputtering process may be used to form a titanium copper (Ti/Cu) seed layer, which is followed by an electroplating, electro-less plating, evaporation, or other process to create a thin layer of copper on top of the seed layer. In one example, the copper layer maybe 5 μm thick, whereas glass substrate 100 may be between 0.15 and 0.25 mm thick, however the scope of embodiments may include any appropriate thickness for a given application. The shape of the metal plating may be achieved through masking and etching the copper and seed layer in the pattern shown in FIG. 2.

Some embodiments may further include copper pillars on top of the metal plating components 102. Such feature is shown at FIG. 3, where copper pillar 108 may be formed through masking and electroplating or other processes. In this example, each of the metal plating components 102 may include a copper pillar 108, which is shaped at the same or substantially the same as its corresponding metal plating component 102. Furthermore, copper pillar 108 may include a surface protection feature, such as a flash Ni or Cu organic solderability preservative (OSP) surface finish. Copper pillar 108 may form a conductive structure that can be used to physically and electrically couple the metal traces on the glass substrate 100 to an electrical contact on a PCB or other substrate. Although, as explained in more detail below, some embodiments may omit copper pillar 108.

FIG. 4 is an illustration of example semiconductor device 400, according to one embodiment. The semiconductor device 400 is fabricated to correspond to the glass substrate 100 described above with respect to FIGS. 1-3. For instance, solder components 404 are in electrical contact with bond pads 401, and solder components 404 align with metal plating components 104. Similarly, solder components 406 align with metal plating components 106 to form the metallic seal structure.

In one example, semiconductor device 400 is formed on a wafer with other semiconductor devices, and the processes described herein to form the solder structures 404 and 406 are performed for each of the different semiconductor devices in the wafer. Of course, any appropriate technique for making semiconductor device 400 may be used in various embodiments.

Looking at solder structure 404 first, it is built upon bond pad 401, where bond pad 401 acts as a signal output for the semiconductor device 400. Solder structure 404 may be formed by first forming a Ti/Cu seed layer and then forming a tin (Sn) layer thereon. The seed layer and the tin layer may then be patterned using masking and etching. In fact, solder structures 404 and 406 may be formed together using the same patterning processes.

In this example, semiconductor device 400 includes active device 410. An example of an active device 410 may include a photodiode or other suitable photo detector. Another example of an active device 410 may include a MEMS device. However, the scope of embodiments is not limited to photo diodes and MEMS devices, as the principles described herein may be applied to any appropriate device built on a semiconductor device 400. However, in the example described with respect to FIGS. 1-10, active device 410 includes a photodiode or a group of photodiodes that are formed at a surface of semiconductor device 400 to be exposed to light through the glass substrate after assembly of the semiconductor device package. In this example, semiconductor device 400 is a silicon chip, the scope of embodiments may include other materials, such as GaAs and the like. For ease of illustration, active device 410 is omitted from FIGS. 6-10, but it is understood that active device 410 is formed in the semiconductor material of device 400 (whether shown or not).

FIG. 4 provides an end-on view of semiconductor device 400, whereas FIG. 5 provides a top-down view. Solder structure 402 is shown as one of many solder structures that each corresponds to a respective bond pad of semiconductor device 400. Solder structure 406 is shown as substantially a rectangle having the same dimensions as plated metal component 106 of FIG. 2.

Figure 8:
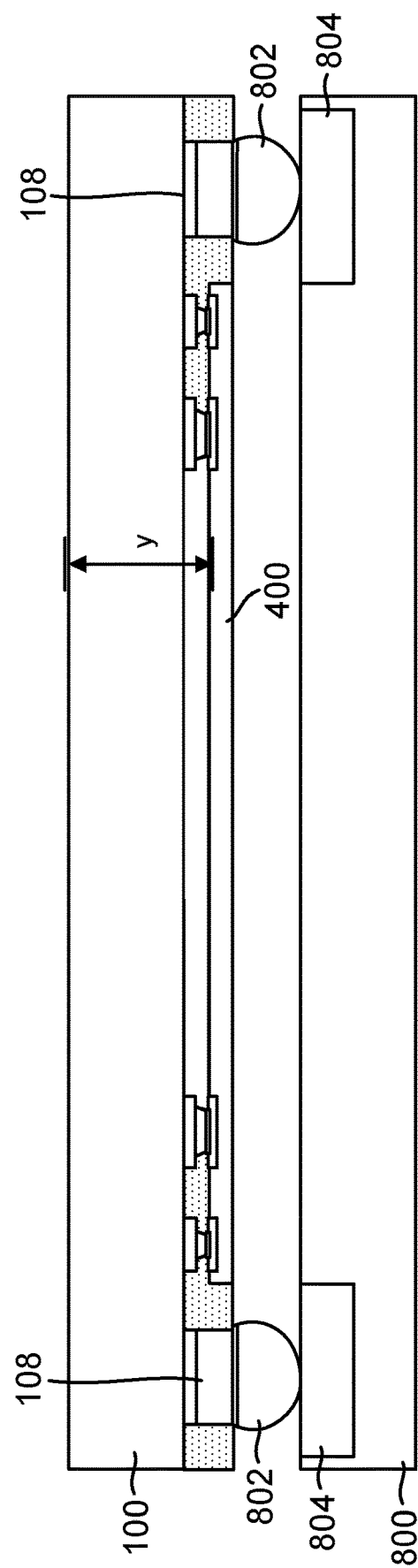
FIG. 8 illustrates an example semiconductor device package, having a glass substrate in semiconductor device mounted to a printed circuit board, in accordance with an embodiment.

FIGS. 6-8 provide an illustration of assembling a chip package, according to one embodiment. Specifically, FIGS. 6-8 illustrate assembling a chip package having solder pillars 108 of FIG. 1. In this example, the height of solder pillars 108 is greater than the height of the surface of semiconductor device 400 to ensure that solder pillars 108 can contact a PCB or other substrate when the package is inverted and mounted. In other words, this example assumes that semiconductor device 400 is a singulated chip during the action shown in FIG. 6.

Semiconductor device 400 is inverted and aligned with glass substrate 100 so that the metal plating components 104, 106 aligned with the solder structures 404, 406 respectively. Semiconductor device 400 is then positioned to make contact among the respective metal plating components 104, 106 and solder structures 404, 406. Once again, in this example, the metal plating structures 104, 106 include copper, whereas the solder structures 404, 406 include tin. At certain temperature such as about 189° C., the contacting of the tin from the semiconductor device 400 and the copper from the glass substrate 100 creates a diffusion bond, which is a mechanical bond of the two pieces. The diffusion forms a copper tin alloy having a re-melting temperature above 400° C. It should be noted that the soldering step to the PCB later may heat solder on top of the copper pillar 108 up to about 250° C. But the temperature of the solder bond to the PCB would not be expected to threaten the integrity of the diffusion bond joints at the bond pads and seal ring.

After the diffusion bonding is complete, the seal ring, which is formed by structures 106 and 406, forms a hermetic seal. In some examples, the diffusion bonding step may be performed in a eutectic environment or in an $N_2$ environment to avoid atmospheric moisture or oxygen.

FIG. 7 shows two different arrangements for the semiconductor device 400 to be mounted to the glass substrate 100, according to various embodiments. After the diffusion bonding, encapsulant 702 is used to create a moisture-proof seal between the bond pads and the seal ring (top example). Encapsulant 702 is applied through Film Assisted Molding (FAM) process using pellet type molding compound as example. In the bottom example of FIG. 7, underfill 705 is an encapsulation method using a dispensing process as alternative to FAM.

FIG. 8 illustrates an example chip package structure mounted to PCB 800, according to one embodiment. The example of FIG. 8 adopts the top example from FIG. 7, however it is understood that the bottom example from FIG. 7 may be adapted in the same way to be mounted to a PCB.

Continuing with the example of FIG. 8, the chip package (including glass substrate 100 and semiconductor device 400) is inverted to be mounted on PCB 800. Solder balls 802 may be applied to the chip package before it is inverted or may be applied to PCB 800 before the chip package is placed upon PCB 800. Heat may be applied to flow solder balls 802 to create a stable mechanical and electrical connection between copper pillars 108 and PCB electrical contacts 804. Although not shown in FIG. 8, it is understood that electrical contacts 804 may be electrically coupled to conductive structures within PCB 800, such as traces and vias. And as explained further below with respect to FIG. 11A, electrical contacts 804 may be electrically coupled to another device (not shown) on PCB 800, such as a computing device so that the electrical signals are conducted between semiconductor device 400 and another device on PCB 800.

Moreover, FIG. 8 does not show the metal plated conductive patterns on glass substrate 100—those are shown at FIG. 2. It is understood that the patterns described above at FIGS. 2 and 5 provide electrical connection between bond pads at semiconductor device 400 and copper pillars 108. Therefore, electrical connections are established between the bond pads of semiconductor device 400 and the electrical contacts 804 of PCB 800.

FIGS. 6-8 illustrate embodiments having copper pillars 108 built on glass substrate 100. By contrast, FIGS. 9A,B and 10A,B illustrate embodiments that omit copper pillars 108. For instance, looking at FIG. 1, glass substrate 100 does not have copper pillars 108 built on it. Without building copper pillars, semiconductor device 400 may be aligned and mounted on glass substrate 100, and then underfill is applied. After that, solder paste may be added by solder paste dispensing machine 950 and followed by reflow process to form solder balls 902. Note that the solder balls 902 are tall enough to clear the surface of semiconductor device 400, thereby allowing the structure of FIG. 9 to be inverted and coupled to a PCB. FIG. 9B illustrates formation of solder balls 902, before and after reflow, according to one embodiment.

Figure 9A:
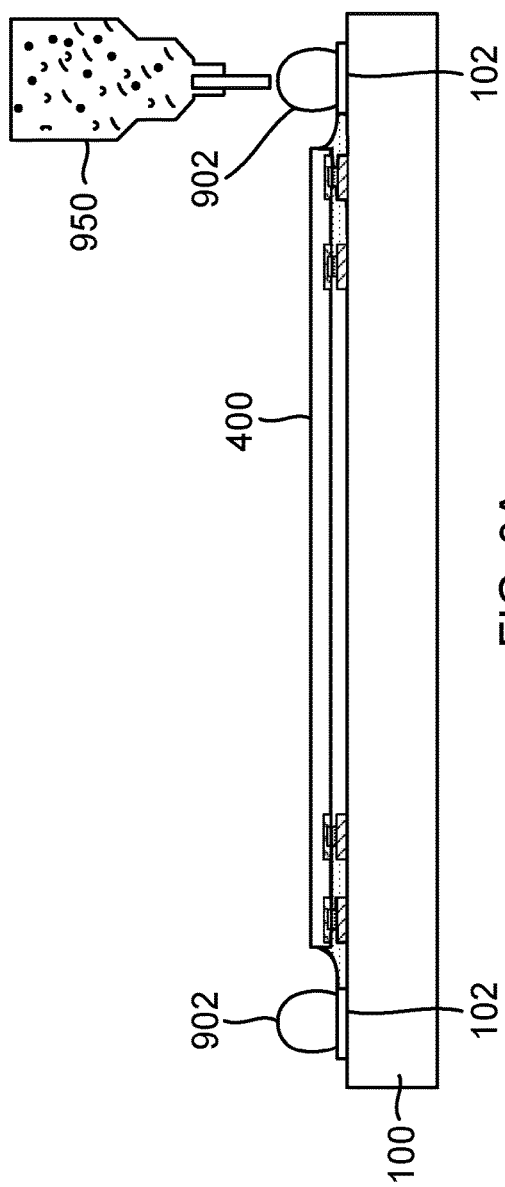
FIGS. 9A,B and 10A,B illustrate example techniques to create solder balls on a glass substrate, in accordance with some embodiments.
Figure 10A:
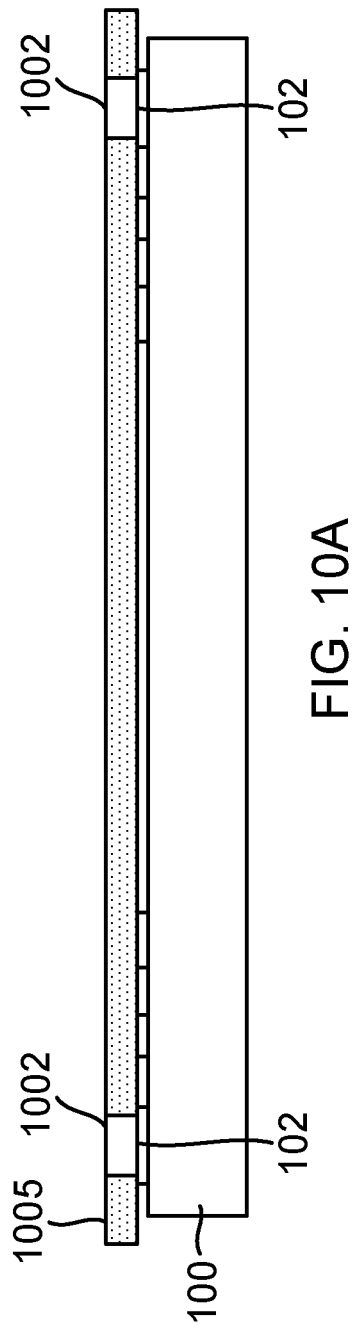
Figure 10B:
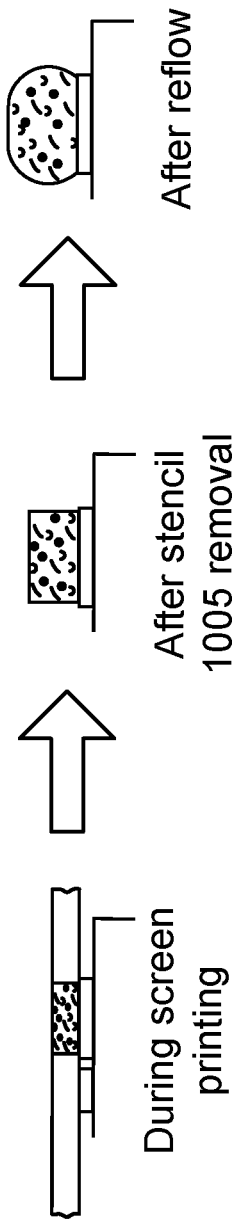

Continuing to the example of FIGS. 10A and B, a solder stencil 1005 is used to screen print a solder paste followed by reflow process to form solder balls 1002. This is in contrast to the use of the solder paste dispensing machine 950 of the embodiment of FIGS. 9A,B. An advantage of using stencil 1005 is that solder balls 1002 may be made much more quickly because they can be made concurrently, especially when applied to a large wafer or rectangle of glass before any particular substrate 100 has been singulated. After the solder balls 1002 are made, such embodiments may include singulating glass substrate 100 and then mounting semiconductor device 400 onto glass substrate 100. FIG. 10B illustrates formation of solder balls 1002, before and after reflow, according to one embodiment.

Figure 9B:
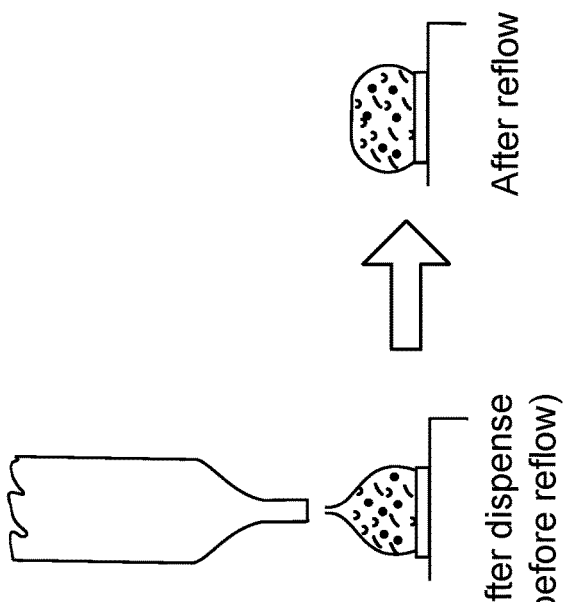

In the case of both FIGS. 9A,B and FIGS. 10A,B, such packages may then be inverted and mounted to a PCB, similar to the arrangement shown in FIG. 8. In other words, taking FIG. 8 as an example, solder balls 902 or 1002 may be mounted to electrical contacts 804 on PCB 800.

Various embodiments may provide advantages over conventional systems. For instance, the use of glass substrate 100, rather than a clear encapsulant, may provide a package that can withstand higher temperatures. This is especially true in embodiments that omit organic adhesives in favor of metallic diffusion bonds between a semiconductor device 400 and the glass substrate 100. Furthermore, the profile of the chip package, and specifically the distance between the surface of active device 410 and a distal surface of the glass substrate 100, maybe reduced by replacing bond wires with metal traces plated on a surface of the glass substrate 100. The distance between the surface of active device 410 and the distal surface of the glass substrate 100 is illustrated as y in FIG. 8, for example. Various embodiments may enjoy more precision as a result of less diffraction, where the profile is reduced.

Figure 11A:
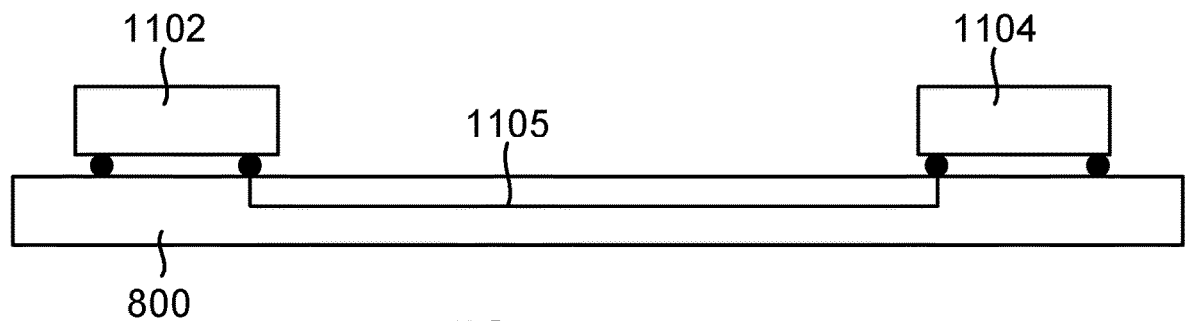
FIG. 11A illustrates an example semiconductor device package mounted to a printed circuit board and a computing device mounted to the printed circuit board, wherein the computing device communicates electrically with the semiconductor device package using conductive structures within the PCB, in accordance with some embodiments.

FIG. 11A is an illustration of an application of an optical detector package, according to one embodiment. Optical detector package 1102 is an example package, such as any of those illustrated at FIGS. 7-9. Specifically, optical detector package 1102 may include a semiconductor device, such as a chip (e.g., semiconductor device 400) mounted to a glass substrate (e.g., glass substrate 100). Optical detector package 1102 is mounted to PCB 800 using solder balls, such as described above with respect to FIG. 8.

PCB 800 also includes computing device 1104. Examples of computing devices suitable for use in the example of FIG. 11A include a CPU, a multicore processor, and ASIC, a microcontroller, and the like. Computing device 1104 may be configured to read and execute computer executable code that is stored to a non-transitory medium located in computing device 1104 or separate from computing device 1104. Computing device 1104 may execute the computer executable code to provide the functionality, such as described below with respect to FIGS. 12A, 12B, and 13. Computing device 1104 is in electrical communication with optical device package 1102 by electrical contacts (not shown) on the surface of PCB 800 and vias and traces collectively illustrated as item 1105. The computing device 1104 may receive electrical signals from optical detector package 1102 and analyze and process the signals to provide meaningful output or control.

Figure 11B:
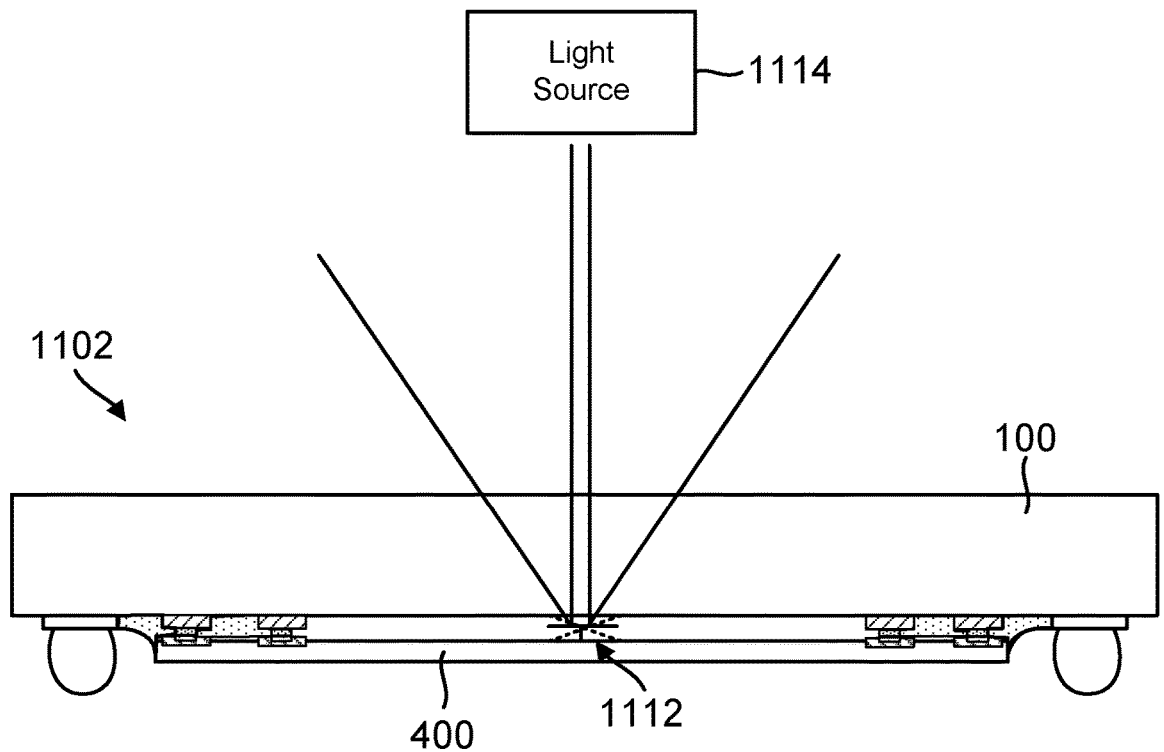
FIG. 11B illustrates an example semiconductor device package mounted to a printed circuit board where the semiconductor device package includes a microelectronic mechanical systems (MEMS) device.

Optical device package 1102 may include a receiving optical device, such as a photodiode, which is configured to receive photons through the glass substrate 100 during normal operation. In other embodiments, optical device package 1102 may include a transmitting optical device, such as a light emitting diode (LED), which is configured to transmit photons through the glass substrate 100 during normal operation. Some embodiments may include both a receiving device and a transmitting device, either in the same optical device package or in different optical device packages. Moreover, and as mentioned above, the scope of embodiments is not limited to optical devices, as MEMS or other devices may be included in the semiconductor device 400 instead of or in addition to optical devices. Thus, in some embodiments item 1102 may include a MEMS package and omit an optical device altogether. An example package having a MEMS device is shown in FIG. 11B. Referring to FIG. 11B, the device package 1102 is similar to the package shown in FIG. 9A, having semiconductor device 400 mounted to glass substrate 100. The semiconductor device 400 includes a MEMS 1112 in place of or in addition to an optical device therein. The MEMS 1112 is configured to reflect light incident thereon from light source 1114. The reflector MEMS 1112 may be a micro-mirror and its tilting may be controlled electronically. By titling the reflector MEMS 1112 with a desired angle, the package 1102 can direct light from light source 1114 (which may be stationary) towards a designated receiver. The hermetic headspace (space between the MEMS 1112 and the nearest surface of the glass substrate) provides room for the tilting in one embodiment.

Referring now to FIGS. 12A and 12B, there are illustrated optical sensor applications 1200 and 1220 according to an embodiment of the present disclosure. Optical device package 1202 may include a light transmitter (e.g., a LED) and be built according to the principles described above with respect to FIGS. 1-10. Similarly, optical device package 1204 may include a light sensor (e.g., a photodiode) and be built according to the principles described above with respect to FIGS. 1-10. It is understood that optical device packages 1202, 1204 may be mounted on a substrate (e.g., a PCB) and electrically connected to a computing device, such as illustrated above with respect to FIG. 11A; however, such details are omitted from FIGS. 12A, B for ease of illustration.

The embodiments of FIGS. 12A, B illustrate transmissive and reflective applications. The principles discussed with respect to FIGS. 11A, 12A, and 12B may be applied to various systems, such as image detectors or fingerprint recognition devices, light sensors, optical switches, microfluidic sorting or fluid sensor systems, and the like.

Beginning at FIG. 12A, there is a slot 1206 between packages 1202, 1204, through which a target medium 1208 may be passed as indicated by the directional arrow 1210. The optical device package 1202 outputs light directed towards optical device package 1204. As the target medium 1208 passes through the slot 1206, the amount of light transmitted through the target medium 1208 changes depending upon the transmittance of the portion of the target medium 1208 that is between optical device package 1202 and optical device package 1204. In some embodiments, a first portion 1212 of target medium 1208 may be more opaque or more reflective than a second portion 1214 of the target medium 1208. For example, the target medium 1208 may be a strip of backing paper with adhesive labels attached to it. In this example, the labels are a first portion 1212 of the target medium 1208 that is more opaque than the backing paper, which is a second portion 1214 of the target medium 1208.

Referring now to FIG. 12B, there is illustrated a reflective embodiment of the present disclosure. In this embodiment, an optical device package 1202 and optical device package 1204 are positioned near each other and a target medium 1208 is passed over both the optical device package 1202 and optical device package 1204, as indicated by the directional arrow 1210. In this embodiment, the optical device package 1202 outputs light directed towards the target medium 1208, and the optical device package 1204 detects light reflected off of the target medium 1208. As the target medium 1208 passes over the optical device packages 1202, 1204 along directional arrow 1210, the amount of light reflected off of the target medium 1208 changes depending upon the reflectance of the portion of the target medium 1208.

In either of the embodiments of FIGS. 12A, B, a computing device (not shown) may receive electrical signals from optical sensors of optical device package 1204, process the signals, and provide some kind of helpful results. For instance, a computing device may be able to detect the presence or absence of target medium 1208, determine motion of target medium 1208, determine a qualitative property (e.g., transmission coefficient) of target medium 1208, or the like.

An example image detector or fingerprint recognition system may conform to the reflective embodiment of FIG. 12B, where the target medium 1208 may include a finger or a medium having an image thereon. An example light sensor may omit a target medium 1208 and light emitting device altogether, instead using a light sensing device in communication with a computer processor to determine whether light intensity is above or below the threshold. An optical switch may include or omit target medium 1208, acting as a light sensor that turns a device on or off depending on whether light intensity is above or below a threshold. In an example microfluidic sorting or fluid sensor, the target medium 1208 may include a fluid in a clear container or pipe that attenuates a transmitted or reflected light and may thus be detected by a computing device in that manner. In an optical encoder embodiment, a light sensing device and computing device may determine motion of a code wheel or code strip.

In another example, packages 1202 and 1204 may be combined in a same package, either as a monolithic silicon or as a dual silicon in one package.

Figure 13:
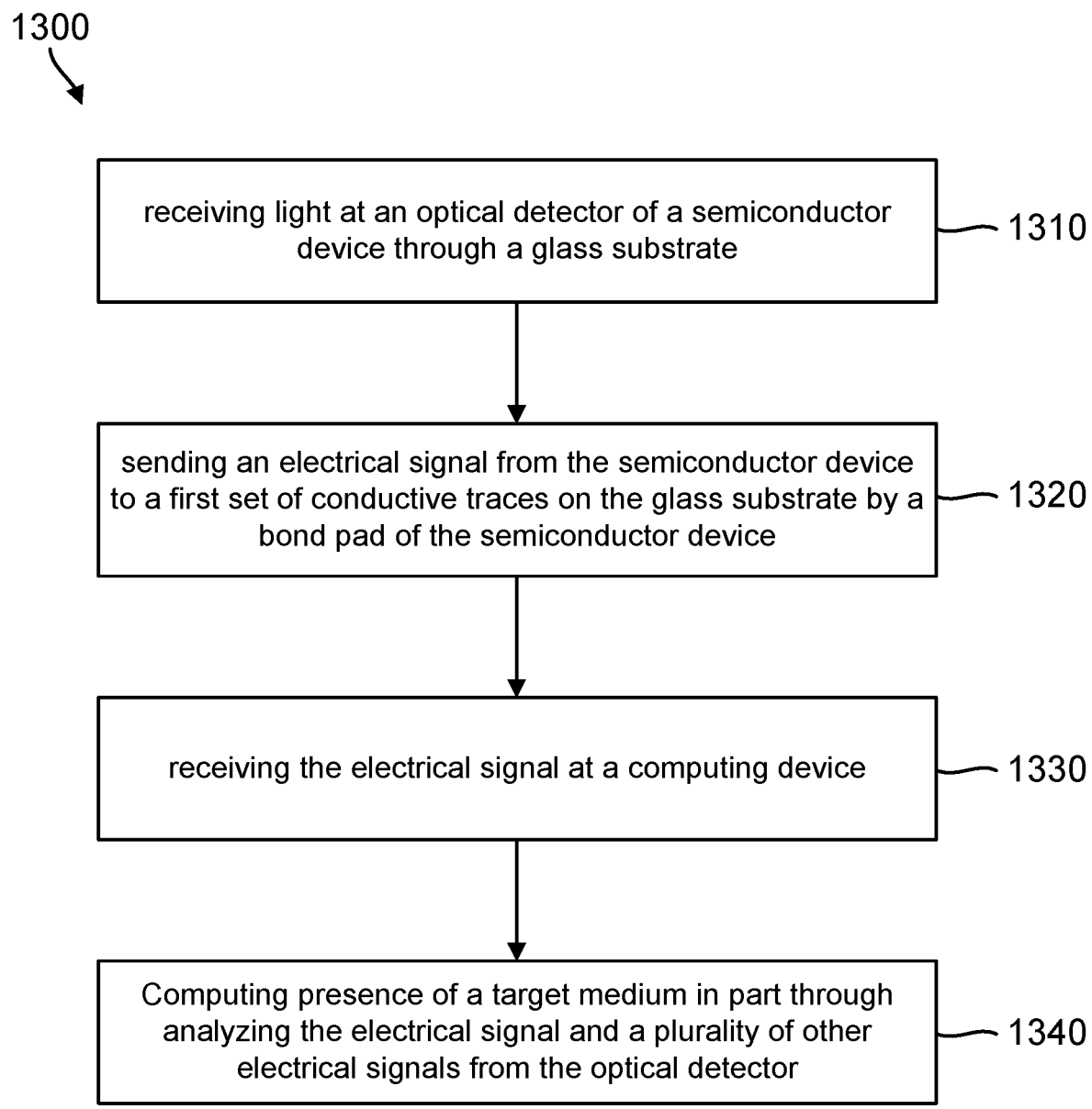
FIG. 13 shows a flow chart of an example method of operating an optical system, wherein that system incorporates a semiconductor device package of any of FIGS. 6-12, in accordance with some embodiments.

FIG. 13 is an illustration of example method 1300 to use a semiconductor device package, according to one embodiment. Method 1300 may be performed by an application, such as those illustrated in FIGS. 11A, 12A, and 12B, which have optical detector packages and computing devices in electrical communication with those optical detector packages.

Action 1310 includes receiving light at an optical detector through the glass substrate. For instance, the optical detector package may include a semiconductor device having an optical sensor thereon. Examples of optical sensors include photodiodes and the like. Taking the embodiment of FIG. 8 as an example, photons may travel through the glass substrate 100 to reach the optical sensor device. The light may be ambient light, light from a specific light source (e.g., an LED as part of a same application), or both. The glass substrate passes the light from an outside environment to the optical detector.

Action 1320 includes sending an electrical signal from the semiconductor device, e.g., in response to receiving the light at action 1310. It should be noted that some optical sensors may provide a signal in response to detecting light, whereas other optical sensors may be programmed to send the electrical signal in response to a detected light falling below a threshold (e.g., an absence of light). In any event, the signal is output from a bond pad of the semiconductor device, wherein the bond pad is electrically coupled with conductive traces on the glass substrate. Example traces on the glass substrate are shown at FIG. 2. Furthermore, the conductive traces may be electrically coupled with conductive structures, such as copper pillars, solder balls, and the like, which are further electrically coupled with vias and traces of a PCB or other substrate.

At action 1330, a computing device (e.g., at package 1104 of FIG. 11A) receives those electrical signals by the vias and traces of the PCB. The computing device may or may not communicate bi-directionally with the semiconductor device.

At action 1340, the computing device computes the presence of a target medium in part through analyzing the electrical signal and a plurality of other electrical signals from the optical detector. In other embodiments, the computing device may detect the absence of the target medium, determine motion of the target medium, determine a qualitative property of the target medium, detect the presence or absence of light, or the like.

The scope of embodiments is not limited to the specific series of actions 1310-1330 of FIG. 13. Rather, other embodiments may add, omit, rearrange, or modify areas actions. For instance, other embodiments may repeat the actions 1310-1340 during normal operation and during an industrial process to provide any desired output or information.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An optical detector device comprising:
a glass substrate having a first metallic ring and first bond pads on a first side of the glass substrate, wherein the first bond pads are outside of a perimeter of the first metallic ring;
a semiconductor device having an optical detector exposed on a side facing the glass substrate, the semiconductor device further including a second metallic ring and second bond pads outside of a perimeter of the second metallic ring and electrically coupled to the first bond pads, wherein the first metallic ring and the second metallic ring are coupled to each other by a metal-metal bond to form a metallic seal structure bonding the first side of the glass substrate with the side of the semiconductor device facing the glass substrate; and
a plurality of conductive structures outside of a perimeter of the semiconductor device, the plurality of conductive structures being electrically coupled to the first bond pads.

2. The optical detector device of claim 1, wherein the first bond pads comprise a Ti/Cu seed layer with additional Cu plated on the Ti/Cu seed layer.

3. The optical detector device of claim 1, wherein the metallic seal structure comprises a ring surrounding the optical detector.

4. The optical detector device of claim 3, wherein the metallic seal structure comprises a Sn Cu diffusion bond.

5. The optical detector device of claim 3, wherein the metallic seal structure comprises a hermetic seal.

6. The optical detector device of claim 1, further comprising a printed circuit board electrically coupled to the plurality of conductive structures.

7. The optical detector device of claim 1, wherein the second bond pads are electrically coupled to the first bond pads by a Sn Cu diffusion bond.

8. The optical detector device of claim 1, wherein the plurality of conductive structures comprise solder balls.

9. The optical detector device of claim 1, wherein the plurality of conductive structures comprise copper pillars formed on the glass substrate.

10. A method for using an optical detector device, wherein the optical detector device comprises a semiconductor device having an optical detector exposed on a first side facing a glass substrate, and first bond pads and a first metallic ring on the first side, the first bond pads being outside of a perimeter of the first metallic ring, wherein the glass substrate includes second bond pads and a second metallic ring, the second bond pads being outside of a perimeter of the second metallic ring, wherein the semiconductor device is bonded to the glass substrate using a metallic seal structure formed by a metal-metal bond between the first metallic ring and the second metallic ring, the method comprising:

receiving light at the optical detector through the glass substrate;

in response to receiving the light at the optical detector, sending a first electrical signal from the semiconductor device to a first set of conductive traces on the glass substrate using at least a subset of the first and second bond pads; and receiving the first electrical signal at a computing device by a conductive structure on the glass substrate and outside of a perimeter of the semiconductor device, the computing device being electrically coupled to the conductive structure on the glass substrate by a conductive structure on a printed circuit board (PCB) on which the conductive structure on the glass substrate is coupled.

11. The method of claim 10, further comprising the following action by the computing device:

computing presence of a target medium in part through analyzing the first electrical signal and a plurality of other electrical signals from the optical detector.

12. An optical sensor system comprising:

a glass substrate configured to pass light from an outside environment to a surface of a semiconductor device;

means for conducting electric signals, wherein the conducting means are formed on a surface of the glass substrate;

means for detecting the light through the glass substrate and for generating the electric signals in response to the light, wherein the light detecting means are formed on the semiconductor device, the semiconductor device further including a plurality of bond pads electrically coupled to the electric signal conducting means;

means for bonding the glass substrate to the semiconductor device, wherein the bonding means includes a first metallic ring formed on the surface of the semiconductor device and a second metallic ring formed on the surface of the glass substrate, the first and the second metallic rings being bonded by a metal-metal bond; and a plurality of conductive structures outside of a perimeter of the semiconductor device, the plurality of conductive structures being electrically coupled to the electric signal conducting means.

13. The optical sensor system of claim 12, wherein the conducting means include conductive traces having a Ti/Cu seed layer with additional Cu plated on the seed layer.

14. The optical sensor system of claim 12, wherein the first metallic ring surrounds the light detecting means.

15. The optical sensor system of claim 14, wherein the metal-metal bond comprises a Sn Cu diffusion bond.

16. The optical sensor system of claim 14, wherein the bonding means comprises a hermetic seal.

17. The optical sensor system of claim 12, further comprising a printed circuit board (PCB) electrically coupled to the plurality of conductive structures.

18. The optical sensor system of claim 17, further comprising a computing device mounted to the PCB and configured to electrically communicate with the light detecting means through traces of the PCB.

19. The optical sensor system of claim 12, wherein the plurality of conductive structures comprise copper pillars formed on the light transmitting means.

20. An electronic device comprising:

a glass substrate having conductive traces, a first metallic ring, and first bond pads plated on a first side of the glass substrate, wherein the conductive traces and the first bond pads are outside of a perimeter of the first metallic ring;

a semiconductor device having a detector exposed on a side facing the glass substrate, the semiconductor device further including a second metallic ring and second bond pads outside of a perimeter of the second metallic ring and electrically coupled to the first bond pads and the conductive traces, wherein the first metallic ring and the second metallic ring are bonded to each other to form a metallic seal structure bonding the first side of the glass substrate with the side of the semiconductor device facing the glass substrate; and a plurality of conductive structures outside of a perimeter of the semiconductor device, the plurality of conductive structures being electrically coupled to the conductive traces.

21. The electronic device of claim 20, wherein the detector comprises an optical detector.

22. The electronic device of claim 20, wherein the detector comprises a microelectronic mechanical systems (MEMS) device.

23. The electronic device of claim 20, wherein the first metallic ring and the second metallic ring are bonded to each other through a Sn Cu diffusion bond.

* * * * *